US006878500B2

(12) United States Patent
Rutter, Jr. et al.

(10) Patent No.: US 6,878,500 B2
(45) Date of Patent: Apr. 12, 2005

(54) STRIPPING METHOD

(75) Inventors: Edward W. Rutter, Jr., Pleasanton, CA (US); Cuong Manh Tran, San Jose, CA (US); Edward C. Orr, Vancouver, WA (US)

(73) Assignee: Marlborough,, Marlborough, MA (US)

( * ) Notice: Subject to any disclaimer, the term of this patent is extended or adjusted under 35 U.S.C. 154(b) by 0 days.

(21) Appl. No.: 10/408,044

(22) Filed: Apr. 5, 2003

(65) Prior Publication Data

US 2004/0076910 A1 Apr. 22, 2004

Related U.S. Application Data

(60) Provisional application No. 60/370,783, filed on Apr. 6, 2002.
(51) Int. Cl.$^7$ ................................................ G03F 7/30
(52) U.S. Cl. .................. 430/256; 430/257; 430/258; 430/259; 430/260; 430/263; 430/331
(58) Field of Search .............................. 430/256, 257, 430/258, 259, 260, 263, 331

(56) References Cited

U.S. PATENT DOCUMENTS

| | | | | |
|---|---|---|---|---|
| 5,866,305 A | | 2/1999 | Chon et al. ................. | 430/331 |
| 6,183,942 B1 | * | 2/2001 | Kim et al. .................. | 430/331 |
| 6,306,564 B1 | * | 10/2001 | Mullee ....................... | 430/329 |
| 6,432,622 B1 | * | 8/2002 | Moon et al. ................ | 430/331 |
| 6,451,223 B1 | * | 9/2002 | Jeon .......................... | 252/79.1 |
| 6,475,292 B1 | * | 11/2002 | Sahbari ...................... | 134/3 |
| 6,589,719 B1 | * | 7/2003 | Ahn et al. ................... | 430/331 |

* cited by examiner

Primary Examiner—Hoa Van Le
(74) Attorney, Agent, or Firm—S. Matthew Cairns

(57) ABSTRACT

Compositions and methods for the removal of patterned photodefinable materials, such as photoresists and/or photoimageable dielectric materials, from substrates are provided. Such compositions and methods are useful in the manufacture of electronic devices. Methods of reworking electronic device substrates by removing patterned photodefinable material from an underlying organic film are also provided.

10 Claims, No Drawings

STRIPPING METHOD

This application claims the benefit of provisional application Ser. No. 60/370,783 filed on Apr. 6, 2002.

BACKGROUND OF THE INVENTION

The present invention relates generally to the field of removal or stripping of photodefinable materials from a substrate used in the manufacture of electronic devices. In particular, the present invention is related to the removal of patterned photoresist and patterned photoimageable dielectric materials from such substrates.

In very general terms, the fabrication of integrated circuits involves steps for producing polished silicon wafers, steps for imaging integrated circuit pattern geometries on the various wafer surfaces, steps for generating the desired pattern on the wafer, and steps for producing dielectric layers on the wafer.

The imaging process involves the use of photoresists applied to the wafer surface. Photoresists are compositions which undergo change in response to light of particular wavelength such that selective exposure of the compositions through a suitable patterned mask, followed by development to remove exposed or non-exposed portions of the photoresist, depending upon whether the resist is positive- or negative-tone, leaves on the surface of the wafer a pattern of resist which replicates either the positive or negative of the mask pattern, and which thus permits subsequent processing steps to be performed to the desired selective pattern.

In the manufacture of electronic devices using wafers, the photoresists are typically liquid compositions of organic light-sensitive materials which are either polymers or are used in conjunction with polymers, dissolved in an organic solvent. Critical to the effectiveness of the selective light exposure and development in forming a resist pattern on the wafer substrate is the initial application of the photoresist composition in a thin layer of essentially uniform thickness on the wafer surface. Typically, such photoresist compositions are applied by spin-coating. In such spin-coating process, a predetermined amount of photoresist composition is disposed on the wafer surface and the wafer is then subjected to rotation, such as at about 500 to about 600 rpm, to cause the photoresist composition to spread out evenly as a layer along the wafer surface and such that excess photoresist is spun off the edges of the wafer.

Despite its widespread use, spin-coating has certain problems. Due to the surface tension of the photoresist composition, some of the resist may wick around to and coat the backside of the wafer during the spin-coating process. Another problem is that as the spin-coating process progresses, the photoresist becomes progressively more viscous as solvent evaporates from the resist composition and in the later stages of the process the resist can leave whiskers of resist which dry on the wafer edge. As the resist continues to dry and increases in viscosity, excess resist is less likely to leave the wafer and instead builds up as an edge bead at the outer edge of the wafer. Such edge beads are typically thicker than the photoresist layer which creates problems for close proximity or contact printing.

Such spin-coating problems cause significant difficulties in overall integrated circuit fabrication processes. Resist on the backside of the wafer can be deposited elsewhere and cause contamination, and also prevents the wafer from lying flat on ultraflat surfaces, thereby affecting focus, alignment, planarity and the like, in subsequent processing steps. Whiskers on the wafer edges can easily break off in subsequent processing steps and cause particulate contamination in virtually all of the manufacturing equipment. Edge beads lead to a distorted surface which can greatly affect focus, alignment, planarity and the like. Edge beads may also crumble and cause particulate contamination.

Conventional methods for removing such residual photoresist on the wafer edge typically include the step of dispensing a stream of solvent at the edge of the wafer to dissolve the photoresist residue. Such solvent stream may be applied to the front side, or back side of the wafer and then wick around to the front side by capillary action, or may be applied to both the front and back sides. A variety of solvents are known for removing photoresist edge beads, such as ethyl lactate and propylene glycol monomethyl ether acetate. For example, U.S. Pat. No. 5,814,433 (Nelson et al.) discloses a mixture of ethyl lactate and N-methylpyrrolidone. Japanese Unexamined Patent Application JP 57 162 336 (Kanazawa) discloses a method for coating a resist onto a wafer. In this patent application, resist edge beads are removed by dissolving the resist in n-butyl acetate. Edge beads are removed prior to patterning of the photoresist. No other uses of these solvents are disclosed in the above references.

Many current processes for manufacturing electronic devices use a photoresist layer atop an underlying organic film such as an antireflective coating, a cross-linked bottom layer of a bi-layer resist, an organic aperture filling material, a lift-off-layer, an organic memory layer and the like. It is often desirable to remove the photoresist layer after it has been patterned without removing the underlying organic film, such as during a rework process. Conventional strippers not only remove the photoresist layer, but also remove or damage the underlying organic film. Such damage includes swelling of the underlying organic film, changes in the surface acidity of the film, or both, among other problems. Accordingly, rework procedures using conventional photoresist strippers are impractical or else require removal of the underlying organic film as well and subsequent reapplication of both the underlying organic film and photoresist top coat. Such rework procedures are costly and time consuming, typically resulting in the discarding of wafers that could otherwise be reused.

There is a need for a method of removing a patterned photoresist layer from an underlying organic film, without removing or damaging such underlying organic film.

U.S. Pat. No. 6,270,949 B1 (Faure et al.) discloses the use of certain alkyl esters of acetic acid as single component developers for photoresists. This patent fails to disclose the use of such solvents to selectively remove a patterned photoresist from an underlying organic film.

U.S. Pat. No. 5,637,436 (Johnson) discloses a mixture of an alkylacetate ester with an alkyl alcohol for use in removing a photoresist edgehead. This patent fails to disclose the use of an alkyl acetate ester to selectively remove a patterned photoresist from an underlying organic film.

SUMMARY OF THE INVENTION

It has been surprisingly found that the ester-containing solvents of the present invention remove patterned photodefinable materials. It has further been found that certain acetate esters may be used to control the rate of removal of patterned photodefinable materials by other removal solvents. It has still further been found that certain ester solvents are useful in removing patterned photodefinable materials, particularly patterned photoresists, from an underlying organic film without substantially removing or damaging such organic film.

The present invention provides a method for removing patterned photodefinable material from a substrate including the step of contacting the patterned photodefinable material with an organic solvent composition comprising one or more ester-containing solvents. Preferably, such patterned photodefinable material is removed from the surface of an organic film.

The present invention further provides a method of removing a patterned photodefinable material, including the steps of: a) providing an electronic device substrate including an organic film and a photodefinable material layer disposed on the organic film; b) imaging the photodefinable material layer; c) developing the imaged photodefinable material layer to provide a patterned photodefinable material; and d) contacting the patterned photodefinable material with an organic solvent composition for a time and at a temperature sufficient to remove the patterned photodefinable material; wherein the organic solvent composition does not substantially remove the organic film, does not substantially swell the organic film and does not substantially change the surface acidity of the organic film.

Also provided by the present invention is a method of reworking an electronic device substrate including the steps of: a) providing an electronic device substrate including an organic film and a photodefinable material layer disposed on the organic film; b) imaging the photodefinable material layer; c) developing the imaged photodefinable material layer to provide a patterned photodefinable material; d) removing the patterned photodefinable material by contacting the patterned photodefinable material with an organic solvent composition for a time and at a temperature sufficient to remove the patterned photodefinable material; and e) disposing a new layer of photodefinable material on the organic film; wherein the organic solvent composition does not substantially remove the organic film, does not substantially swell the organic film and does not substantially change the surface acidity of the organic film.

DETAILED DESCRIPTION OF THE INVENTION

As used throughout this specification, the following abbreviations shall have the following meanings, unless the context clearly indicates otherwise: %  wt=weight percent; $\mu$m=micron=micrometer; nm=nanometer; ° C.=degrees Centigrade; sec.=second; min.=minute; Å=angstrom; ca.=approximately; mL=milliliter; DI=deionized; and rpm=revolutions per minute.

The term "alkyl" refers to linear, branched and cyclic alkyl. "(Meth)acrylate" refers to both acrylate and methacrylate. The terms "resin" and "polymer" are used interchangeably throughout this specification. "Polymer" includes homopolymers and copolymers. All amounts are percentages by weight and all ratios are by weight, unless otherwise indicated. All numerical ranges are inclusive and combinable in any order, except where it is clear that such numerical ranges are constrained to add up to 100%.

The present invention provides a method of removing a patterned photodefinable material from an electronic device substrate including the steps of: a) providing an electronic device substrate having an organic film and a photodefinable material layer disposed on the organic film; b) imaging the photodefinable material layer through a mask; c) developing the imaged photodefinable material layer to provide a patterned photodefinable material; and d) removing the patterned photodefinable material by contacting the patterned photodefinable material with an organic solvent composition for a time and at a temperature sufficient to remove the patterned photodefinable material; wherein the organic solvent composition does not substantially remove the organic film, does not substantially swell the organic film and does not substantially change the surface acidity of the organic film. A "mask" as used herein refers to a photomask or artwork used to provide the pattern to be imaged.

Any electronic device substrate that is useful in the manufacture of electronic devices, and particularly integrated circuits, may be used in the present invention. It is preferred that the substrate is a wafer, such as a silicon or gallium arsenide wafer, used in the manufacture of integrated circuits. Such wafers may include one or more layers of other materials, such as, but are not limited to, silicon, aluminum, polymeric resins, silicon dioxide, doped silicon dioxide, silicon resins, silicon germanium, gallium arsenide, silicon nitride, tantalum, copper, polysilicon, ceramics, aluminum/copper mixtures, organic polysilica and the like.

Such substrates have an organic film disposed thereon. The term "organic film" as used herein refers to any polymeric layer that is used under an organic photodefinable material layer. In general, the organic films are solvent resistant. Particularly useful solvent resistant organic films include cross-linked polymeric layers. Suitable organic films include, but are not limited to, antireflective coatings, lift-off layers, aperture or via filling layers, organic etch stop layers, organic dielectric layers, lower layers of a bi-layer or multi-layer resist, organic memory layers, and the like. Such organic films are well known in the art and are generally commercially available. For example, suitable antireflective coatings useful as organic films are those disclosed in U.S. Pat. No. 5,851,738 (Thackeray et al.). Suitable aperture filling compositions are those disclosed in European Patent Application No. EP 1 150 343 A2 (Rutter et al.). The organic films are applied to the substrate using conventional techniques. The thickness of such organic films may vary over a wide range, depending on the particular organic film employed, but is typically up to about 5–10 $\mu$m, preferably up to 5 $\mu$m, more preferably up to 2 $\mu$m and most preferably up to 1 $\mu$m. Such organic films typically have a minimum thickness of 0.1 $\mu$m, although thinner films may be advantageously used.

While the specific compositions of such organic films may vary considerably, such films are typically cross-linked polymeric networks. Such polyermized networks are generally prepared in situ by thermal polyermization or photopolymerization of a composition containing a binder polymer or oligomer and a cross-linking agent. Suitable binder polymers for the organic films include, but are not limited to, (meth)acrylate polymers, novolak polymers, poly(hydroxystyrene) polymers, cyclic olefin polymers, and the like, as well as mixtures thereof. In general, the organic films do not contain a photoactive component, such as a photoacid or photobase generator. However, for certain applications, a small amount of a photoacid or photobase generator may be present in such organic films. For example, certain bottom antireflective coatings contain a small amount of a photoacid or photobase generator to control footing and/or undercutting of the patterned image. The amount of such photoacid or photobase in the organic films is typically less than the amount necessary to make such films photodefinable. The organic films are typically at least partially cured (polymerized) prior to contact with, or application of, the photodefinable material, and preferably such organic films are cured prior to application of the photodefinable material onto such organic film.

A variety of photodefinable materials may suitably be disposed on the organic film. Such photodefinable material is in intimate contact with the organic film. Suitable photodefinable materials include, but are not limited to, photoresists and photoimageable dielectric materials. In general, such photodefinable materials contain a binder polymer, a cross-linking agent and a photoactive component, such as a photoacid or photobase generator, and may contain additional components to improve the patterned image. Typically, the photoresists are positive-acting and may contain a variety of compositions. Exemplary photoresists may contain novolack resins, poly(hydroxystyrene) resins, (meth)acrylate resins, cyclic olefin resins, siloxane resins, sisequioxane resins, and the like, as well as mixtures thereof. Particularly suitable photoresists include those containing one or more novolak resins, such as mixed isomer cresol/formaldehyde novolaks, phenol/formaldehyde novolaks, mixed isomer cresol/phenol/formaldehyde novolaks and the like, silsesquioxane resins, (meth)acrylate resins and cyclic olefin resins. Particularly suitable photodefinable materials are silicon-containing photoresist, and more particularly photoresists containing silsesquioxane-containing binder polymers. Preferably, such photoresists are chemically amplified. Suitable photoresists are those sold by Shipley Company L.L.C. (Marlborough, Mass.). In the case of a wafer used in the manufacture of an integrated circuit, the photoresist is spin coated on the wafer to provide a layer having a desired thickness.

Suitable thicknesses of the photoresist layer are up to about 5 $\mu$m, preferably up to 2 $\mu$m and more preferably up to 1 $\mu$m. Typically, the photoresist layer has a minimum thickness of 0.1 $\mu$m, although thinner layers may be advantageously used.

Suitable dielectric materials useful in the present invention are any which are or may be made to be photoimageable, and include, but are not limited to: inorganic matrix materials such as carbides, oxides, nitrides and oxyfluorides of silicon, boron, or aluminum; silicones; siloxanes, such as silsesquioxanes; silicates; silazanes; and organic matrix materials such as benzocyclobutenes, poly(aryl esters), poly(ether ketones), polycarbonates, polyimides, fluorinated polyimides, polynorbornenes, poly(arylene ethers), polyaromatic hydrocarbons, such as polynaphthalene, polyquinoxalines, poly(perfluorinated hydrocarbons) such as poly(tetrafluoroethylene), and polybenzoxazoles. Particularly suitable dielectric materials are organic matrix materials. Suitable dielectric materials are available under the tradenames TEFLON, AVATREL, BCB, AEROGEL, XEROGEL, SILK, PARYLENE F, and PARYLENE N. Other suitable dielectric materials include organic polysilicas such as silsesquioxane—containing dielectrics.

The photodefinable materials may be coated on the substrate by any conventional technique, such as screen coating (or screen printing), curtain coating, roller coating, slot coating, spin coating, flood coating, electrostatic spray, spray coating, dip coating and as a dry film. Spin coating is preferred. Such coating techniques are well know to these skilled in the art.

Once the photodefinable material composition has been spin coated to form a layer of photodefinable material on the organic film, the photodefinable material layer is "softbaked". The photodefinable material layer is next imaged through a mask using actinic radiation of the appropriate wavelength for the photoresist, such as 248 nm, 193 nm, 157 nm, EUV, e-beam, and the like. Imaging of a positive-acting photoresist renders the imaged areas more soluble than the non-imaged areas of the photoresist.

The imaged photodefinable material layer is next developed to form a patterned photodefinable material. Such development removes the areas rendered more soluble during imaging of the positive-acting photodefinable material and may be achieved through the use of certain organic solvents or dilute alkaline compositions. Suitable developers are generally commercially available.

In certain circumstances, it is desirable to remove the patterned photodefinable material. For example, there may be problems with the pattern just imaged. The patterned photodefinable material can be completely removed from the wafer-substrate without substantially damaging or removing the underlying organic film by contacting the patterned photodefinable material with a selected organic solvent as described herein. Suitable organic solvents are any which do not substantially remove the organic film, do not substantially swell the organic film and do not substantially change the surface acidity of the organic film. By "does not substantially remove the organic film" it is meant that $\leq 10\%$, preferably $\leq 8\%$, more preferably $\leq 5\%$, and still more preferably $\leq 3\%$, by thickness of the organic film is removed. "Does not substantially swell the organic film" means that the thickness change of the organic film due to uptake of the organic solvent is $\leq 5\%$, preferably $\leq 3\%$, more preferably $\leq 2\%$, still more preferably $\leq 1\%$.

The term "surface acidity" refers to the level of acid or base within, at or near the surface of the organic film. Accordingly, the term "surface acidity" includes the concept of surface basicity and surface neutrality. It is important that the present organic solvents do not substantially change the level of acidity, basicity or neutrality of the organic film, i.e. the solvents are selected so as to maintain the acidity of the film at or near the optimized level for the particular application. The surface acidity of the organic film, as well as the acidity of the bulk organic film, is typically an important property that is tailored to the specific composition and function of the organic film. The increasing or decreasing of the acidity of the organic film may adversely affect certain properties of the organic film, such as the compatibility of the organic film with the photodefinable material layer. For example, an antireflective coating may contain a certain level of acid or base in the surface and/or bulk of the coating in order to prevent any base or acid generated during exposure of a chemically amplified positive-acting photoresist atop such antireflective coating from reacting with, attacking or otherwise interacting with the antireflective coating. Accordingly, it is not desirable to use organic solvents that may affect the surface acidity of the organic film, such as strong bases such as amine-containing solvents or strong acids such as carboxylic acid-containing solvents having a $pK_a \leq 3.5$ or sulfonic acid-containing solvents. Surface acidity is typically determined by examining the pattern following imaging and development of the photodefinable material layer. Changes in surface acidity are manifested in the presence of footing in the pattern. By "does not substantially change the surface acidity of the organic film" it is meant that after imaging and development of the photodefinable material, extension of the foot (or bottom of the pattern) from the vertical image does not differ from the critical dimension of the image by more than $\pm 20\%$, preferably $\pm 15\%$, more preferably $\pm 10\%$, still more preferably $\pm 8\%$, and even more preferably $\pm 5\%$.

Particularly useful organic solvents include, but are not limited to, ester-containing organic solvents. As used herein, "ester-containing solvents" refers to any organic solvent containing an ester functionality, including lactones. Preferably, such ester-containing solvents are free of amine functionalities and/or strong acid functionalities, i.e. carboxylic acid (i.e. $CO_2H$) functionalities having a $pK_a \leq 3.5$, and sulfonic acid (i.e. $SO_3H$) functionalities. Exemplary ester-containing solvents include, but are not limited to, alkyl or alkyleneoxy esters of a ($C_2$–$C_4$) carboxylic acid. Such carboxylic acid moieties may be optionally substituted such as by having one or more of its hydrogens replaced with a hydroxyl group. Suitable carboxylic acids used to prepare the present ester-containing solvents include, but are not limited to, acetic acid, propionic acid and lactic acid. Particularly useful ester-containing solvents include ($C_4$–$C_{12}$)alkyl acetate esters such as n-butyl acetate, iso-butyl acetate, tert-butyl acetate, amyl acetate, iso-amyl acetate, and hexyl acetate; ethyleneglycol mono($C_1$–$C_6$) alkyl ether acetates such as ethyleneglycol monomethyl ether acetate and ethyleneglycol monobutyl ether acetate; higher homologues of ethyleneglycol mono($C_1$–$C_6$)alkyl ether acetates; propyleneglycol mono($C_1$–$C_6$)alkyl ether acetates such as propyleneglycol monomethyl ether acetate; higher homologues of propyleneglycol mono($C_1$–$C_6$)alkyl ether acetates such as dipropyleneglycol monomethyl ether acetate, tripropyleneglycol monomethyl ether acetate and dipropyleneglycol monobutyl ether acetate; ($C_1$–$C_{12}$)alkyl lactate esters such as ethyl lactate; lactones such as γ-butyrolactone; and mixtures thereof. It will be appreciated by those skilled in the art that such ester-containing solvents may also contain small amounts of the component carboxylic acids and alcohols. Such small amounts of carboxylic acid are typically tolerated, unless such carboxylic acids have a $pK_a \leq 3.5$. Preferably, such ester-containing solvents are substantially free of the component alcohol, i.e. then contain less than 1% wt of such alcohol. The term "component alcohol" refers to the alcohol used to form the ester. For example, ethanol is the component alcohol for both ethyl lactate and ethyl acetate.

In one embodiment, the present invention provides a method for removing patterned photodefinable material from a substrate including the step of contacting the patterned photodefinable material with an organic solvent composition comprising one or more ester-containing solvents.

Suitable other organic solvents that may be used in the present invention include, but are not limited to, ethers such as ethylene glycol monomethyl ether, ethylene glycol dimethyl ether, ethylene glycol monobutyl ether, propylene glycol monomethyl ether, propylene glycol dimethyl ether and propylene glycol monobutyl ether; ketones such as acetone, 2-heptanone, methyl ethyl ketone and methyl isobutyl ketone; polar aprotic solvents such as dimethyl sulfoxide; alcohols; glycols such as ethylene glycol, diethylene glycol, triethylene glycol, polyethylene glycol, propylene glycol, dipropylene glycol, tripropylene glycol and polypropylene glycol; and alkylene carbonates such as propylene carbonate.

More than one organic solvent may be used in the present invention. Such multiple solvents may be used sequentially as individual solvents or may be used in admixture. When used in admixture, they may be used in any proportion, as long as such admixture does not substantially remove, swell or change the surface acidity of the underlying organic film. For example, when two organic solvents are used in admixture, such as a combination of γ-butyrolactone and dimethyl sulfoxide, such solvents may be present in any ratio from 1:99 to 99:1, and preferably from 10:90 to 90:10. Such organic solvents are generally commercially available from a variety of sources and may be used without further purification. However, such solvents may be filtered prior to use in order to ensure low levels of particulates and impurities in the solvent. In one embodiment, the organic solvent composition is substantially free of water, i.e. contains $\leq 1\%$ wt water, and preferably $\leq 0.5\%$ wt.

The patterned photodefinable material to be removed is contacted with the one or more organic solvents for a period of time and at a temperature sufficient to at least partially remove the patterned photodefinable material. The exact period of time will vary across a wide range depending upon the composition of the photodefinable material and the specific organic solvent employed. Typically, the material to be removed is contacted with the organic solvent for a period of time from about 1 second to about 15 minutes, more typically from about 2 seconds to about 10 minutes, and still more typically from about 5 seconds to about 7 minutes.

The organic solvent may be used in the present invention at ambient temperature or may be heated. Thus, the organic solvent may be used advantageously at a wide variety of temperatures, such as at about 15° C. or greater. The upper temperature limit is the boiling point of the particular organic solvent used. For safety, such organic solvents are typically heated up to about 10° C. below their flash point.

The photodefinable material may be contacted with the organic solvent by any conventional means. Typically, the organic solvent is dispensed on the material to be removed, such as by spraying, dripping, flood coating or dipping the substrate in a bath containing the organic solvent. It is preferred that the organic solvent is sprayed, dripped or flooded onto the material to be removed. The organic solvent may be applied to a spinning substrate, a static substrate or a combination of these.

Typically, such patterned photodefinable materials are removed by the organic solvent prior to any hard baking (or full curing or cross-linking) of the photodefinable material step. Thus, the patterned photodefinable materials are removed prior to the occurrence of any substantial cross-linking. The present organic solvent may be used to completely remove any patterned photodefinable material from the surface of the substrate or organic film prior to any substantial amount of cross-linking, such as, for example, when such photodefinable material was improperly applied, imaged or developed.

In another embodiment, ($C_4$–$C_{12}$)alkyl acetate esters can also be used to control or adjust the removal or stripping rate of photodefinable materials by conventional solvents. By combining the ($C_4$–$C_{12}$)alkyl acetate esters of the present invention with known organic solvent photodefinable material strippers, the rate of removal of the photodefinable material may be controlled. Increasing the ratio of ($C_4$–$C_{12}$) alkyl acetate esters to other organic solvents will decrease the removal rate of photodefinable material as compared to the rate of removal by the other solvent alone. Likewise, decreasing the ratio of ($C_4$–$C_{12}$)alkyl acetate esters to other organic solvents will increase the removal rate of photodefinable material. Therefore, by controlling the ratio of ($C_4$–$C_{12}$)alkyl acetate esters to other known organic solvents, the rate of removal of patterned or unpatterned photodefinable materials may be adjusted to provide the removal of the desired amount of material without overstripping while reducing or eliminating the formation of mounds or hillocks. Thus, the present invention provides a method for controlling removal of patterned or unpatterned photodefinable material from a substrate using a composition including one or more ($C_4$–$C_{12}$)alkyl acetate esters and one or more organic solvents, provided that when ($C_4$)alkyl acetate ester is used the alkyl group has a tertiary or quaternary carbon, including the step of controlling the amount of ($C_4$–$C_{12}$)alkyl acetate esters in the composition. Suitable other organic solvents include those described above.

In the alternative, the ratio of ($C_4$–$C_{12}$)alkyl acetate esters to one or more organic solvents may be changed during the photoresist or dielectric material removal process. Such ratio change may be affected by varying the ratio of each of the components in the solvent stream as it is dispensed on the wafer. This may be easily accomplished by a variety of means, such as by using two solvent vessels, one for the $(C_4-C_{12})$alkyl acetate esters and one for the one or more organic solvents, and combining the two solvents into one stream for dispensing onto the photoresist or dielectric material to be removed.

The present invention is particularly suitable for use in the manufacture of electronic devices, such as integrated circuits, semiconductors, and the like. The present invention also provides a method of reworking an electronic device substrate comprising the steps of: a) providing an electronic device substrate comprising an organic film and a photodefinable material layer disposed on the organic film; b) imaging the photodefinable material layer through a mask; c) developing the imaged photodefinable material layer to provide a patterned photodefinable material; d) contacting the patterned photodefinable material with an organic solvent composition or a time and at a temperature sufficient to remove the patterned photodefinable material; and e) disposing a new layer of photodefinable on the organic film; wherein the organic solvent composition does not substantially remove the organic film, does not substantially swell the organic film and does not substantially change the surface acidity of the organic film. In another embodiment, the present invention provides present invention provides a method of reworking an electronic device substrate comprising the steps of: a) providing an electronic device substrate comprising a photodefinable material layer disposed on a substrate; b) imaging the photodefinable material layer through a mask; c) developing the imaged photodefinable material layer to provide a patterned photodefinable material; d) contacting the patterned photodefinable material with an organic solvent composition for a time and at a temperature sufficient to remove the patterned photodefinable material; and e) disposing a new layer of photodefinable on the substrate; wherein the organic solvent composition comprises one or more ester-containing solvents.

In an alternate embodiment, the present invention also provides a method of reworking an electronic device substrate comprising the steps of: a) providing on a track an electronic device substrate comprising an organic film and a patterned photodefinable material disposed on the organic film; b) removing the patterned photodefinable material comprising the steps of: i) spinning the electronic device substrate at a first spin speed and disposing on the patterned photodefinable material a first amount of an organic solvent composition; and ii) spinning the electronic device substrate at a second spin speed while disposing a second amount of the organic solvent on the patterned photodefinable material; c) spinning the electronic device substrate at a third spin speed; and d) disposing a layer of photodefinable material on the organic film; wherein the organic solvent composition does not substantially remove the organic film, does not substantially swell the organic film and does not substantially change the surface acidity of the organic film. The term "track" is well understood in the art and refers to a track in a spin coating tool. A wide variety of spin speeds may be used. The first, second and third spin speeds may be the same or different. Typically, the first spin speed is from 0 to 100 rpm, and more typically 0 rpm, i.e. that the substrate is static when the first amount of organic solvent composition is disposed on the patterned photodefinable material. The second spin rate is typically from 100 to 2500 rpm. The third spin speed is typically from 1500 to 5000 rpm, and more typically from 200 to 3500 rpm. A hard baking step may optionally be performed between steps c) and d) above. Such hard bake step may not be necessary if the solvent used to remove the patterned photodefinable material is the same as that used to dispose the photodefinable material on the organic layer.

The following examples are presented to illustrate further various aspects of the present invention, but are not intended to limit the scope of the invention in any aspect.

EXAMPLE 1

A sufficient amount of commercially available, deep UV photoresist, UV86 (available from Shipley Company, Marlborough, Mass.), was spin coated on a series of wafers at 3000 rpm to provide a 0.6 μm thick photoresist layer. The photoresist was then baked at 130° C. for 60 seconds. A number of solvents were evaluated for removing the photoresist at 20° to 21° C. using a laser-based dissolution rate monitor. This experiment was repeated four times for each solvent for a total of five replicates. The results are reported in Table 1.

TABLE 1

| Sample | Solvent | Dissolution Rate (Å/sec.) |
|---|---|---|
| 1 | Hexyl acetate | 56 |
| 2 | tert-Butyl acetate | 79 |
| 3 | Amyl acetate | 324 |
| 4 | 3-Ethoxyethyl propionate | 2394 |
| 5 | Propylene glycol monomethyl ether acetate | 2476 |
| 6 | 2-Heptanone | 2752 |
| 7 | Ethyl lactate | 4746 |
| 8 | 10% n-Butyl acetate in ethyl lactate | 6304 |
| 9 | Propylene glycol monomethyl ether | 22,669 |
| 10 | Ethyl acetate | 34,627 |

EXAMPLE 2

Example 1 was repeated except that a sufficient amount of a commercially available, advanced I-line DNQ novolak photoresist, SPR 660 (available from Shipley Company), was spin coated on the wafers at 3000 rpm to provide a 1.0 μm thick photoresist layer. The photoresist was then baked at 90° C. for 90 seconds. A number of solvents were evaluated according to the procedures of Example 1. Four to five replicates were evaluated for each solvent. The results are reported in Table 2.

TABLE 2

| Sample | Solvent | Dissolution Rate (Å/sec.) |
|---|---|---|
| 11 | tert-Butyl acetate | 789 |
| 12 | Hexyl acetate | 2177 |
| 13 | Amyl acetate | 2814 |
| 14 | Ethyl lactate | 3505 |
| 15 | Propylene glycol monomethyl ether acetate | 4247 |
| 16 | 10% n-Butyl acetate in ethyl lactate | 4329 |
| 17 | 3-Ethoxyethyl propionate | 6760 |
| 18 | 2-Heptanone | 9356 |
| 19 | Propylene glycol monomethyl ether | 14,396 |
| 20 | Ethyl acetate | 44,783 |

EXAMPLE 3

A sufficient amount of a commercially available photoresist, UV210 (available from Shipley Company) was spin coated on a wafer at 3000 rpm to provide a 0.5 μm thick photoresist coating. The photoresist was baked at 130° C. for 60 seconds. Four solvents, n-butyl acetate, tert-butyl acetate, amyl acetate and hexyl acetate, were evaluated for their ability to dissolve the photoresist. The results are reported in Table 3.

TABLE 3

| Sample | Solvent | Dissolution Rate (Å/sec.) |
|---|---|---|
| 21 | tert-Butyl acetate | 57 |
| 22 | Amyl acetate | 436 |
| 23 | Hexyl acetate | 295 |
| 24 | n-Butyl lactate | 2836 |
| 25 | Propyl acetate | 8677 |

EXAMPLE 4

Silicon wafers were coated to 5500 Å with a non-photoimageable composition containing a novolak resin, a cross-linking agent and thermal acid generator to form the lower layer of a bi-layer resist. This lower layer was cured (i.e. cross-linked) at 250° C. for 60 sec. Onto this cured lower layer was disposed 2000 Å of a photoimageable top layer containing an silsesquioxane resin, a cross-linking agent and a photoacid generator. The top layer was soft baked at 90° C. for 90 sec. to remove solvent.

The photoimageable top layer was removed by contacting the wafers with an organic solvent composition containing a 1/1 mixture of γ-butyrolactone and dimethyl sulfoxide at 23° C. for 1, 2 or 3 minutes. After which time, the wafers were rinsed with DI water for 1 min., dried with nitrogen and then hard baked at 90°. Scanning electron micrographs ("SEMs") of the wafers were taken and in each case the photoimageable layer was completely removed while the organic film remained intact.

The wafer that was contacted with the organic solvent for 3 minutes was evaluated for loss of the organic film (i.e. non-photoimageable lower layer). Analysis of this wafer using a NanoSpec™ 3000 Series automated film thickness measurement system (available from Nanometrics) showed that the thickness of the organic film was 5400 Å after removal of the photoimageable layer, a loss of 100 Å, or 1.8%.

EXAMPLE 5

A silicon wafer was coated with a 5500 Å thick layer of a non-photoimageable composition containing a novolak resin, a cross-linking agent and thermal acid generator. This composition was cured (i.e. cross-linked) at 250° C. for 60 sec. This cured organic film was then contacted with an organic solvent composition containing a 1/1 mixture of γ-butyrolactone and dimethyl sulfoxide at 23° C. for 5 minutes. Analysis of the film thickness according to the procedure of Example 4 after solvent contact showed that only ca. 200 Å of the organic film was removed, a loss of ca. 3.6%.

EXAMPLE 6

The procedure of Example 4 was repeated except that the non-photoimageable lower layer (organic film) contained a poly(hydroxstyrene) resin, a cross-linking agent and a thermal acid generator and was coated to a thickness of ca. 5300 Å and cured at 170° C. for 60 sec. The photoimageable silsesquioxane-containing top layer was coated to a thickness of ca. 2000 Å and soft baked at 90° C. for 90 sec. to remove solvent.

The photoimageable layer was then removed by immersing the wafers in amyl acetate (organic solvent) at 23° C. for 1 minute (Wafer A), 2 minutes (Wafer B) or 3 minutes (Wafer C), followed by rinsing with DI water and drying with nitrogen. The wafers were then hard baked at 90°. SEMs indicated that the photoimageable top layer was completely removed from each wafer.

The combined thickness of the photoimageable top layer and non-photoimageable lower layer of each wafer was determined before removal of the top layer according to the procedure of Example 4. The thickness of the non-photoimageable, lower layer remaining on the wafer (organic film) was determined both after the removal of the top layer and after the hard baking ("HB") step according to the procedure of Example 4. The difference in the thickness of the bottom layer after removal of the top layer and after the HB step indicates the amount of swelling due to solvent uptake by the lower layer. These results are reported in Table 4.

TABLE 4

|  | Wafer A | Wafer B | Wafer C |
|---|---|---|---|
| Combined thickness (Å) | 7295 | 7302 | 7303 |
| Thickness of lower layer after top layer removal (Å) | 5324 | 5332 | 5330 |
| Thickness of lower layer after HB step (Å) | 5305 | 5311 | 5310 |
| Swelling (Å) | 19 | 21 | 20 |
| Swelling (%) | 0.4 | 0.4 | 0.4 |

As can be seen from the above data, amyl acetate is a very effective solvent for the removal of a photodefinable material, which does not substantially swell or remove the organic film (i.e. lower layer).

EXAMPLE 7

A wafer is placed on a track and a non-photoimageable lower layer (organic film) containing a poly(hydroxstyrene) resin, a cross-linking agent and a thermal acid generator and is coated to a thickness of ca. 5300 Å and is then cured at 170° C. for 60 sec. A photoimageable top layer of containing a silsesquioxane, a cross-linking agent and a photoacid generator is then coated on the lower layer to a thickness of ca. 2000 Å and is then soft baked at 90° C. for 90 sec. to remove solvent. The top layer is then imaged at an appropriate wavelength, e.g. 248 nm, and is then developed using an appropriate developer to form a patterned top layer.

The patterned top layer is next removed or stripped by adding 20 mL of amyl acetate to the static patterned. The wafer containing a puddle of amyl acetate is allowed to sit for 20 sec. The wafer is then spun for 20 sec. at 1100 rpm while an additional 40 mL of amyl acetate are applied. Once the additional amyl acetate is applied to the spinning wafer, the spin speed is increased to 3000 rpm for 30 sec. to dry the wafer and ensure complete removal of the patterned top layer. The wafer is next hard baked at 90° C. for 30 sec. to ensure the remaining lower layer is free of any solvent to complete the rework procedure. A new photoimageable top layer is then applied to the lower layer and the top layer is then soft baked. The new photoimageable top layer can then be imaged at the appropriate wavelength and developed to form a patterned photoimageable material (or top layer).

EXAMPLE 8

Silicon wafers containing an organic film were contacted with an ester-containing solvent at room temperature for 1 min. to determine the amount of solvent uptake or swelling of such film. Wafer D contained a layer of cross-linked novolak resin and Wafer E contained a layer of cross-linked poly(vinylpyrrolidone) resin. The solvents evaluated were ethyl lactate and propyleneglycol monomethyl ether acetate ("PGMEA"). The thickness of the organic film was determined prior to and after contact with the solvent. No HB step was used. The thickness measurements were made according to the procedure of Example 4 and are reported in Table 5 as the average of five different measurements.

TABLE 5

| Wafer | Solvent | Thickness Before (Å) | Thickness After (Å) |
|---|---|---|---|
| D | Ethyl lactate | 5328 | 5320 |
|   | PGMEA | 5300 | 5292 |
| E | Ethyl lactate | 5272 | 5270 |
|   | PGMEA | 5249 | 5250 |

From the above data it can be seen that the change in thickness of the organic film after contact with an ester-containing solvent is negligible.

What is claimed is:

1. A method for removing patterned photodefinable material from an integrated circuit substrate comprising the step of contacting the patterned photodefinable material with an organic solvent composition comprising one or more ester-containing solvents chosen from iso-butyl acetate, tert-butyl acetate, iso-amyl acetate and hexyl acetate, wherein the substrate comprises an organic film chosen from antireflective coatings, lift-off layers, organic etch stop layers, organic dielectric materials, lower or bi-layer photoresist, organic memory layers and aperture filling coatings.

2. A method for removing patterned photodefinable material comprising of the steps of: a) providing an electronic device substrate comprising an organic film and a photodefinable material layer disposed on the organic film; b) imaging the photodefinable material layer; c) developing the imaged photodefinable material layer to provide a patterned photodefinable material; and d) contacting the patterned photodefinable material with an organic solvant composition for a time and at a temperature sufficient to remove the patterned photodefinable material without substantially removing the organic film, wherein the organic solvent composition comprises one or more ester-containing solvents selected from the group consisting of iso-butyl acetate, tert-butyl acetate, iso-amyl acetate and hexyl acetate.

3. The method of claim 2, wherein the photodefinable material is a photoresist or a photoimageable dielectric material.

4. The method of claim 3, wherein the photoresist is positive-acting.

5. The method of claim 2, wherein the organic film is selected from the group consisting of antireflective coatings, lift-off layers, organic etch stop layers, organic dielectric materials, lower layer of a bi-layer photoresist, organic memory layers and aperture filling coatings.

6. A method of reworking an electronic device substrate comprising the steps of: a) providing an electronic device substrate comprising an organic film and a photodefinable material layer disposed on the organic film; b) imaging the photodefinable material layer; c) developing the imaged photodefinable material layer to provide a patterned photodefinable material; d) contacting the patterned photodefinable material with an organic solvent composition for a time and at a temperature sufficient to remove the patterned photodefinable material without substantially removing the organic film; and e) disposing a new layer of photoresist on the organic film; wherein the organic solvent composition comprises one or more ester-containing solvents selected from the group consisting of iso-butyl acetate, tert-butyl acetate, iso-amyl acetate and hexyl acetate.

7. The method of claim 6, wherein the photodefinable material is a photoresist or a photoimageable dielectric material.

8. The method of claim 7, wherein the photoresist is positive-acting.

9. The method of claim 6, wherein the organic film is selected from the group consisting of antireflective coatings, lift-off layers, organic dielectric materials, lower layer of a bi-layer photoresist, organic memory layers and aperture filling coatings.

10. A method for removing patterned photodefinable material comprising of the steps of: a) providing an electronic device substrate comprising an organic film comprising an organic memory layer and a photodefinable material layer disposed on the organic film; b) imaging the photodefinable material layer; c) developing the imaged photodefinable material layer to provide a patterned photodefinable material; and d) contacting the patterned photodefinable material with an organic solvent composition for a time and at a temperature sufficient to remove the patterned photodefinable material without substantially removing the organic film, wherein the organic solvent composition comprises an alkyl or alkyleneoxy ester of a carboxylic acid chosen from acetic acid, propanoic acid and lactic acid.

* * * * *